United States Patent
Li et al.

(10) Patent No.: US 11,453,941 B2
(45) Date of Patent: Sep. 27, 2022

(54) CERIUM OXIDE COATING, ITS PREPARATION AND USE

(71) Applicant: City University of Hong Kong, Kowloon (HK)

(72) Inventors: Kwok Yan Li, Kowloon (HK); Zhen Shi, Jiujiang (CN); Po Wan Shum, Tai Po (HK); Zhifeng Zhou, Ma On Shan (HK)

(73) Assignee: City University of Hong Kong, Kowloon (HK)

( * ) Notice: Subject to any disclaimer, the term of this patent is extended or adjusted under 35 U.S.C. 154(b) by 470 days.

(21) Appl. No.: 15/444,494

(22) Filed: Feb. 28, 2017

(65) Prior Publication Data

US 2018/0245203 A1    Aug. 30, 2018

(51) Int. Cl.
*C23C 14/08*    (2006.01)
*C23C 14/00*    (2006.01)
(Continued)

(52) U.S. Cl.
CPC .......... *C23C 14/08* (2013.01); *C23C 14/0036* (2013.01); *C23C 14/021* (2013.01);
(Continued)

(58) Field of Classification Search
CPC ..... C23C 14/08; C23C 14/3485; C23C 14/35; C23C 14/0036; C23C 14/021; C23C 14/345; H01J 37/3426
See application file for complete search history.

(56) References Cited

U.S. PATENT DOCUMENTS

| 8,105,466 B2* | 1/2012 | Zhang ................. C23C 14/5873 |
| | | 204/192.13 |
| 2010/0025230 A1* | 2/2010 | Ehiasarian ........ H01J 37/32045 |
| | | 204/192.12 |

FOREIGN PATENT DOCUMENTS

| CN | 101362632 A | 2/2009 |
| CN | 103351803 A | 10/2013 |
| CN | 103765599 A | 4/2014 |

OTHER PUBLICATIONS

Park, I., Lin, J., Moore, J., Khafizov, M., Hurley D., Manuel, M., Allen, T. Grain growth and mechanical properties of CeO2-x films deposited on Si(100) substrates by pulsed dc magnetron sputtering. Surface and Coatings Technology, vol. 217, Feb. 25, 2013, p. 34-38 [online] [Accessed on Nov. 25, 2019] (Year: 2012).*

(Continued)

*Primary Examiner* — Michael A Band
(74) *Attorney, Agent, or Firm* — Renner Kenner Greive Bobak Taylor & Weber

(57) ABSTRACT

A method for preparing a $CeO_x$ coating on a surface of a substrate includes depositing a $CeO_x$ coating on the surface by means of a reactive magnetron sputtering from a pure cerium target. The $CeO_x$ coating can be transparent for visible light. A method for reducing the adhesion of a tissue material such as from a human to a surface of a medical instrument, for reducing the water condensation and improving the heat transfer performance of a heat exchanger surface of a substrate, and for reducing corrosion of a surface of a substrate includes depositing a $CeO_x$ coating on the substrate by means of a reactive magnetron sputtering from a pure cerium target. This provides an environmentally friendly preparation of the $CeO_x$ coating with no need for organic solvents or volatile organic compounds. The $CeO_x$ coating has good hydrophobicity, enhanced hardness, exceptionally high wear resistance, and superior thermal stability.

18 Claims, 1 Drawing Sheet

(51) Int. Cl.
C23C 14/35 (2006.01)
C23C 14/34 (2006.01)
C23C 14/02 (2006.01)
H01J 37/34 (2006.01)

(52) U.S. Cl.
CPC ........ *C23C 14/345* (2013.01); *C23C 14/3485* (2013.01); *C23C 14/35* (2013.01); *H01J 37/3426* (2013.01)

(56) References Cited

OTHER PUBLICATIONS

Ershov, S.; Druart, M.; Poelman, M.; Cossement, D.; Snyders, R.; Olivier, M. "Deposition of cerium oxide thin films by reactive magnetron sputtering for the development of corrosion protective coatings". Corrosion Science, vol. 75, Oct. 2013, p. 158-168. [online] (Year: 2013).*

Murugan, R.; Vijayaprasath, G.; Ravi, G. "The influence of substrate temperature on the optical and microstructural properties of cerium oxide thin films deposited by RFsputtering" Superlattices and Microstructres vol. 85, Jun. 2015, p. 321-330 [online] (Year: 2015).*

'Room temperature' definition. Google definition [https://www.google.com/search?q=room+temperature&rlz=1C1GCEB_en&oq=room+temp&aqs=chrome.1.69i57j0l5j69i60l2.2386j0j1&sourceid=chrome&ie=UTF-8] [Accessed on May 28, 2020].*

Shi, Z.; Shum, P.; Zhou, Z.; Li, L. "Effect of bias voltage on the properties of CeO2-x coatings prepared by magnetron sputtering". Surface & Coatings Technology, 326, p. 411-416 [online] (Year: 2016).*

Kelly, P.; Arnell, R. "Magnetron sputtering: a review of recent developments and applications". Vacuum, 56, p. 159-172 [online] (Year: 1999).*

Holmann, E.; Zaitsev, A.; Loginov, V.; Likholetov, Y. "CeO2 films deposited by DC reactive magnetrin sputter". Journal of Physics D: Applied Physics. p. 504-505[ online] (Year: 1992).*

Brown, Robert; Bellido-Gonzalez, Victor. "Comparison of balanced and unbalanced array designs." Thin film and PV solution. (Year: 2013).*

Shi, Z.; Shum, P.; Zhou, Z.; Li, L. "Effect of oxygen flow ratio on the wetting behavior, microstructure and mechanical properties of CeO2-x coatings prepared by magnetron sputtering". Surface & Coatings Technology, vol. 320. p. 333-338 (Year: 2016).*

Savvides, A.; Thorley, A.; Gnanarajan, S.; Katsaros, A. "Epitaxial growth of cerium oxide thin film buffer layers deposited by d.c. magnetron sputtering". Thin Solid Films, vol. 388. p. 177-182 (Year: 2001).*

Ta, M.; B,; Briand, D.; Guhel, Y.; Bernard, J.; Pesant, J.; Boudart, B. "Growth and structural characterization of cerium oxide thin films realized on Si(111) substrates by on-axis r.f. magnetron sputtering". Thin Solid Films, vol. 517. p. 450-452 (Year: 2008).*

Van Steenberge, S.; Leroy, W.; Depla, D. "Influence of oxygen flow and film thickness on the texture and microstructure of sputtered ceria thin films". Thin Solid Films, vol. 553. p. 2-6 (Year: 2013).*

* cited by examiner

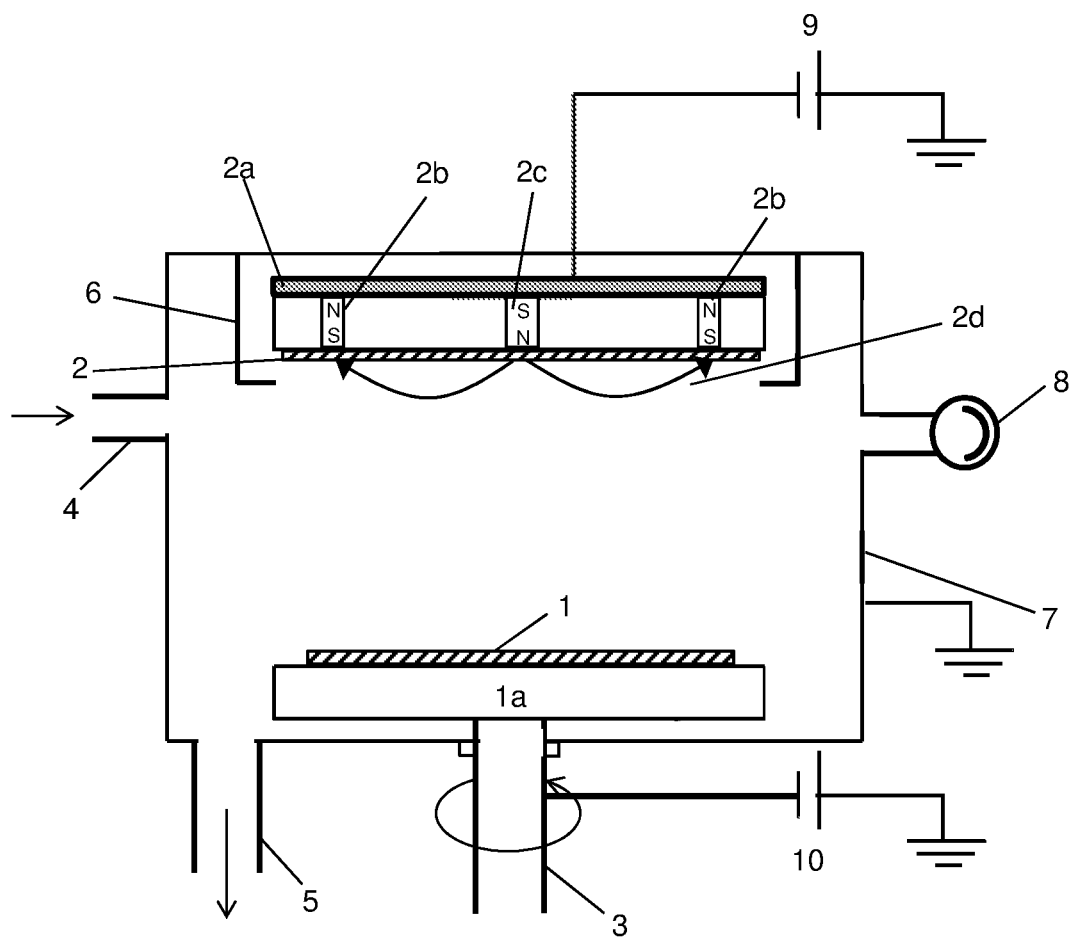

CERIUM OXIDE COATING, ITS PREPARATION AND USE

TECHNICAL FIELD

The present invention relates to a method for preparing a $CeO_x$ coating on a surface of a substrate. Said method comprises a step of depositing the $CeO_x$ coating on the surface by means of a reactive magnetron sputtering from a pure cerium target. The present invention further provides a $CeO_x$ coating obtained by the method described above. The $CeO_x$ coating can be transparent for visible light. In a further aspect, the present invention refers to methods for reducing the adhesion of a tissue material such as from a human to a surface of a medical instrument, for reducing the water condensation and improving the heat transfer performance of a heat exchanger surface of a substrate and for reducing corrosion of a surface of a substrate comprising depositing a $CeO_x$ coating on the substrate by means of a reactive magnetron sputtering from a pure cerium target.

BACKGROUND OF THE INVENTION

Hydrophobic coatings have drawn a lot of interest in both research and industry due to their practical uses, including self-cleaning, anti-fingerprint and anti-sticking applications. For example, the interest in self-cleaning surfaces is being driven by the desire to fabricate such surfaces for satellite dishes, solar energy panel, architectural glass and green houses.

The introduction of the low-surface-energy coatings, such as fluorocarbons, silicones and organic materials can lead to hydrophobic surfaces. Polymer-based coatings are of particular interest in this regard due to their extremely low surface energies. Another well-known material with low surface energy is silicone. Because of its intrinsic deformability and hydrophobic properties, this material can readily be used for hydrophobic surfaces.

Making a proper rough surface can increase the hydrophobicity of a surface. In view of the methods for fabricating rough surfaces, two general approaches have been developed, including physical and chemical methods. Lithography is a well-established physical technique for creating periodic micro-/nano-patterns. Sol-gel is a typical example of chemical methods. A sol is usually prepared by hydrolysis of the corresponding oxide in the presence of a solvent. During the network formation process, a large amount of solvent is also impregnated in the network and thus a gel is formed. Therefore, the surface roughness of the materials fabricated via the sol-gel method can be easily adjusted through changing the protocol of the method and the composition of the reaction mixture. Such hydrophobic coatings are receiving more and more attention, and the potential applications are increasingly recognized.

However, the current obstacles that significantly limit the applicability of available hydrophobic materials and their use are their poor wear resistance, poor adhesion to a substrate and their low mechanical and thermodynamic stability. Wear resistance is an important issue in realizing several applications of hydrophobic surfaces. There are not many reports addressing this issue. Wu et al. (Thin Solid Films 457, 2004, 122) have used microwave plasma enhanced CVD to prepare hydrophobic thin films. The mechanical properties of the resulting surfaces were tested by rubbing the surface with flannel cloth under 200 g of load. It has been found that the water repellent capability decreased and the contact angle dropped approximately 20°.

Meanwhile, Parkin et al. (J. Mater. Chem. 19, 2009, 1074) prepared super-hydrophobic elastomeric surfaces through aerosol-based deposition with high contact angle, while Cao et al. (Wuhan Univ. Technol. 23, 2008, 513) utilized electrodeposition to create microstructure surfaces that mimicked the lotus leaf. They both have shown that the surfaces are only effective under standard atmospheric conditions. The surfaces will degrade under high stress pressure, heat or abrasion.

The conventional soft polymer-based coatings can no longer satisfy the increasing requirements of modern hydrophobic applications. For example, it is known that polymer-based coatings currently used in anti-fingerprint, anti-fogging and self-cleaning industries are relatively soft with low adhesion and durability. In addition, they may decompose under higher temperatures. Another example is the use of polymer-based coatings as non-sticking surface to reduce sticking of charred tissue to the blade in electro surgery. Coating degradation due to the fluorine mass transfer at elevated temperatures is frequently observed. More seriously, Teflon has been linked to cancer, organ damage and other health effects in tests on laboratory animals. Due to these limitations, only short term devices such as disposable microfluidics, degradable structures, and temporary surface enhancements are viable since deterioration is not a major constraint.

Accordingly, there remains a strong need for coatings which provide a good hydrophobicity, sufficient hardness and wear resistance while having sufficient thermal stability for the different applications. Respective methods for preparing them should allow for an environmentally friendly preparation and should be suitable for large scale production.

SUMMARY OF THE INVENTION

The first aspect of the present invention relates to a method for preparing a $CeO_x$ coating on a surface of a substrate. Said method comprises a step of depositing the $CeO_x$ coating on the surface by means of a reactive magnetron sputtering from a pure cerium target.

The reactive magnetron sputtering is in particular carried out with a substrate bias voltage of between about −60 V and −100 V with the substrate bias voltage being pulsed in the frequency range of about 100 kHz to about 350 kHz, in particular 250 kHz. The working gas is in particular high purity argon and the reactive gas is in particular high purity oxygen and the oxygen to argon flow ratio is in particular in the range of about 20% to about 100%.

The method can further comprise a step of cleaning the substrate comprising plasma cleaning before the deposition.

The present invention further provides a $CeO_x$ coating obtained by the method described above, which is in particular hydrophobic with a contact angle for water of about 110°. The hardness is in particular about 18 GPa and the thickness of the coating is in particular in the range of from about 10 nm to about 1 μm. The $CeO_x$ coating can be transparent for visible light.

In a further aspect, the present invention refers to a method for reducing the adhesion of a tissue material such as from a human to a surface of a medical instrument. Said method comprises depositing a $CeO_x$ coating on the surface by means of a reactive magnetron sputtering from a pure cerium target. The surface is in particular of steel.

In another aspect, the present invention provides a method for reducing the water condensation and improving the heat transfer performance of a heat exchanger surface of a substrate. Said method comprises depositing a $CeO_x$ coating on the surface by means of a reactive magnetron sputtering from a pure cerium target.

In a further aspect, the present invention provides a method for reducing the corrosion of a surface of a substrate comprising depositing a $CeO_x$ coating on the substrate by means of a reactive magnetron sputtering from a pure cerium target and wherein the surface contains a metal or a metal alloy or both of them. Reducing corrosion in particular includes increasing hardness, wear resistance and endurance of the surface.

Reactive magnetron sputtering provides a significant increase in the ionization rate resulting from enhanced plasma confined by the specific magnetic field around the target, and is especially suitable for industrial applications with the main advantages of high deposition rate and high adhesion strength. The closed magnetic field coupling of the method of the present invention results in a high degree of ionization and bias current density. The method of the present invention further allows for an environmentally friendly deposition of the coating with no need for organic solvents or volatile organic compounds.

Due to the fact that inner unfilled 4f orbitals are shielded by the full octet of electrons in the outer $5s^25p^6$ shell, cerium oxide ($CeO_x$) coatings have lower tendency to form hydrogen bonds at the interface with water molecules, resulting in exceptional hydrophobic properties. In addition, the $CeO_x$ coatings obtained with the method of the present invention proved to allow for excellent mechanical properties and an advantageously high thermal stability. The inventors could show that the $CeO_x$ coatings not only have good hydrophobicity, but also have enhanced hardness, wear resistance and thermal stability. In other words, the $CeO_x$ coatings can be applied to substrates used in harsh environments as the wear resistance and the endurance of its surfaces can be substantially enhanced. Thus, the $CeO_x$ coatings can be exploited in a wide variety of applications, including touch screen panels, self-cleaning glasses, solar energy panels, satellite dishes, textiles and nonstick cookware, etc.

Further, the method of the present invention allows for preparing a $CeO_x$ coating which is optically transparent for the visible light. The unique properties of the $CeO_x$ coating make it especially suitable to be used in harsh environments that soft polymer-based coatings or artificial rough surfaces have never been used.

Those skilled in the art will appreciate that the invention described herein is susceptible to variations and modifications other than those specifically described. The invention includes all such variations and modifications. The invention also includes all steps and features referred to or indicated in the specification, individually or collectively, and any and all combinations of the steps or features.

Other features and aspects of the invention will become apparent by consideration of the following detailed description and accompanying drawings.

BRIEF DESCRIPTION OF THE DRAWINGS

FIG. 1 shows a schematic representation of a deposition chamber which may be used in the method of the present invention.

DETAILED DESCRIPTION OF THE INVENTION

Unless otherwise defined, all technical terms used herein have the same meaning as commonly understood by one skilled in the art to which the invention belongs.

As used herein, "comprising" means including the following elements but not excluding others. "Essentially consisting of" means that the material consists of the respective element along with usually and unavoidable impurities such as side products and components usually resulting from the respective preparation or method for obtaining the material such as traces of further components or solvents. The expression that a material "is" an element as used herein means that it essentially consists of said element. As used herein, the forms "a," "an," and "the," are intended to include the singular and plural forms unless the context clearly indicates otherwise.

The present invention provides in a first aspect a method for preparing a $CeO_x$ coating on a surface of a substrate. Said method comprises a step of depositing the $CeO_x$ coating on the surface by means of a reactive magnetron sputtering from a pure cerium target. With said method a hydrophobic surface with high hardness and high thermal stability can be obtained.

Sputtering which is a physical vapor deposition (PVD) technology utilizes the erosive action of accelerated ions at the surface of a target material as source of the formed coating. These ions have enough energy to remove, i.e. to sputter particles at a target surface, here the pure cerium (Ce) target. Under high vacuum an electrical field is generated in a sputtering apparatus with a deposition chamber between an anode and the target (cathode). Argon (Ar) is ionized by means of electrical voltage generating a glow discharge. Positive $Ar^+$ ions are accelerated towards the target and sputter the atoms on its surface. In magnetron sputtering, magnets are placed in the proximate to the target to keep the density of the sputtering ions very high further increasing the sputtering efficiency. In reactive magnetron sputtering, there is further a reactive gas present reacting with the atoms sputtered from the target during the coating deposition on the substrate, i.e., the sputtered atoms or particles undergo a chemical reaction with the reactive gas before deposited on the substrate. The deposited coating is therefore different from the target.

As used herein, the term "coating" means at least one deposited layer applied to at least a part or all of an exposed surface of the substrate. The coating can be formed by one or more than one layer.

The "substrate" can have any form and shape and is, for example, a layer, a multi-layer structure or a block of one or more material having at least one surface onto which the $CeO_x$ coating can be deposited. The $CeO_x$ coating can be deposited onto one or more surfaces of the substrate, in particular to all surfaces of the substrate.

$CeO_x$ coating which is also referenced as "cerium oxide coating" means a coating comprising and in particular essentially consisting of oxides of cerium, which oxides in particular comprise and are more preferably formed by oxides of trivalent and tetravalent cerium.

The cerium target is a solid cerium target that can provide the cerium atoms for the deposition of $CeO_x$ by means of reactive magnetron sputtering, i.e. high energy ion bombardment. The cerium target is solid, preferably a solid pure cerium metallic target. "Pure" as used for the cerium target means a purity, i.e. absence of impurities, of at least about 99.9% and in particular of at least about 99.95% and further preferred of at least about 99.99%, i.e. this means that impurities are present in an amount of at most about 0.1%, in particular at most about 0.05% and further preferred of at most about 0.01%. The term "metallic target" means cerium in metallic form.

The reactive magnetron sputtering is preferably carried out with a sputtering voltage of about −200 V to about −500 V, i.e. a pulsed voltage is applied to the cathode of about −200 V to about −500 V.

The bias ion current density can be, for example, between about 1 mA/cm$^2$ and about 5 mA/cm$^2$.

In this invention, the closed magnetic field coupling results in a high degree of ionization and bias current density.

Preferably, a substrate bias voltage of about −60 V to about −100 V, i.e. a small negative voltage, is applied to the substrate for controlling and adjusting the structure and properties of the CeO$_x$ coating during deposition. More preferably, said substrate bias voltage is pulsed in the frequency range of about 100 kHz to about 350 kHz, most preferably at about 250 kHz. Pulsing the substrate bias voltage in the said frequency range can significantly increase the ion current drawn at the substrate, i.e. in most preferred embodiments, the substrate is biased with pulsed DC at a frequency of 250 kHz.

The reactive magnetron sputtering is preferably carried out with a sputtering pressure, i.e. a deposition chamber pressure, of about 1 mTorr (0.13 Pa) to about 5 mTorr (0.66 Pa) for obtaining a sustainable plasma in the deposition chamber.

The substrate temperature during the reactive magnetron sputtering is preferably kept at a temperature in the range of about 20° C. to about 300° C.

The distance between the pure cerium target and the surface of the substrate onto which the CeO$_x$ coating is to be deposited in the deposition chamber can be between about 5 cm and about 15 cm. The obtained deposition rate during the reactive magnetron sputtering is up to 30 nm/min depending on the sputtering power applied to the pure cerium target.

The reactive magnetron sputtering is carried out with a mixture of a working gas for sputtering the pure cerium target and a reactive gas able to react with the atoms sputtered from the pure cerium target during the deposition of the coating on the substrate for forming the CeO$_x$ coating which is provided into the deposition chamber. The working gas is preferably argon, in particular high purity argon, and the reactive gas preferably comprises and more preferably is oxygen, in particular high purity oxygen, i.e. the CeO$_x$ coating is preferably deposited by reactive magnetron sputtering of a pure cerium target in a gas mixture of high purity argon and high purity oxygen. By adjusting the gas flow ratio of argon and oxygen, the stoichiometry of the CeO$_x$ coating can be controlled. The oxygen to argon flow ratio is preferably in the range of about 20% to about 100%.

Argon and oxygen used are preferably of high purity, which means herein a gas purity of at least about 99.9% and in particular at least about 99.99%, i.e. this means that impurities are present in an amount of at most about 0.1% and further preferred of at most about 0.01%.

The reactive magnetron sputtering is in particular carried out at a temperature between about 20° C. and about 30° C., more preferably at room temperature, i.e. at about 25±2° C., without external heating to the substrate.

In an embodiment of the present invention which is schematically illustrated in FIG. 1, the reactive magnetron sputtering is carried out in a deposition chamber with vacuum (7), i.e. evacuated to a low pressure, which deposition chamber comprises the substrate (1), a substrate holder (1a) connected to a rotating shaft (3), the pure cerium target (cathode) (2), a magnet holding plate (2a) with a ring magnet (2b) and a central magnet (2c). The distance between the substrate (1) and the pure cerium target (2) is a few cm such as about 5 cm to about 15 cm. The sputtering voltage is, for example, between about −200V and about −500V and applied to the pure cerium target. A negative bias voltage is applied to the substrate. Means for heating the substrate may be further provided (not shown), and the backside of the target as well as the magnets are cooled by water at about 20° C. The magnetic field around the target is also illustrated with magnetic field lines (2d) in FIG. 1. Further, an inlet (4) for Ar/O$_2$ mixed gas is provided, i.e. for working gas and reactive gas supply into the deposition chamber via mass flow controllers. The deposition chamber further has a vacuum gauge (8) and an outlet to the vacuum pump (5) for keeping the vacuum in the deposition chamber. A pulsed power supply (9) (frequency 100 kHz to 350 kHz) is connected to the cerium target for sputtering, and a bias power supply (10) to the substrate holder (i.e., frequency at 250 kHz).

In preferred embodiments of the present invention, the method further comprises a step of cleaning the substrate comprising plasma cleaning before the deposition which further improves the coating-to-substrate adhesion. The term "plasma cleaning" is generally known to refer to methods for removal of organic matter and/or impurities from substrate surfaces through the use of an ionized gas called plasma in a vacuum chamber. Inert gas such as argon can be used for plasma cleaning. One of skill in the art is aware of the methods and conditions for carrying them out. Plasma cleaning should be carried out at higher bias voltage, such as about −300 V to about −600 V, by means of the re-sputtering effect at the substrate surface, such that the impurities on the substrate surface can be etched away by plasma.

The present invention in another aspect refers to a CeO$_x$ coating obtainable by and further preferred obtained by the method as described above. Said CeO$_x$ coating is preferably hydrophobic.

The term "hydrophobic" as used herein refers to the property of the CeO$_x$ coating of being hydrophobic, i.e., difficult to wet. Wetting is the ability of a liquid to maintain contact with a solid surface, resulting from intermolecular interactions. If the contact angle is greater than 90° for a water droplet brought in contact with a surface of the CeO$_x$ coating, then it is considered to be hydrophobic. As used herein, the term "contact angle" is the angle between a drop of water and a flat and horizontal surface upon which the droplet is placed, here a surface of the CeO$_x$ coating. The term "hydrophobic" is preferably characterized by a contact angle for water of greater than about 90°, preferred greater than about 100° and more preferred of about 110°, which means that the water droplet does not wet the surface of the CeO$_x$ coating.

The CeO$_x$ coating preferably comprises and more preferable essentially consists of oxides of trivalent and/or tetravalent cerium such as Ce$_2$O$_3$ and/or CeO$_2$ and is more preferred a mixture of both, i.e., a mixture of oxides of Ce$^{3+}$ and Ce$^{4+}$, namely preferably a mixture of CeO$_2$ and Ce$_2$O$_3$. The composition of the CeO$_x$ coating can be determined with methods known to one of skill in the art, in particular with X-ray photoelectron spectroscopy (XPS) measurements. The CeO$_x$ coating further has highly advantageous and unique properties such as self-cleaning, anti-wear and anti-sticking properties. The coating preferably crystallizes predominantly in a cubic fluorite structure.

The CeO$_x$ coating preferably has a hardness of 18 GPa at a temperature between about 20° C. and about 30° C. Hardness means the resistance to permanent deformation and can be determined with methods known to one of skill in the art such as Nano-indentation, in which the applied load is very small. As the coating is rather thin and in particular has a thickness of from about 10 nm to about 1 μm, the indentation depth should not exceed 10% of the coating thickness to minimize the influence of the substrate.

The coating thickness can be in the range of from about 10 nm to about 1 μm. The thickness of the coating refers to the average distance between the surface of the coating in contact with the substrate and the opposite surface of the $CeO_x$ coating. "Average distance" means the average of the distance between the two surfaces of the $CeO_x$ coating measured at at least 3 different positions along the of the $CeO_x$ coating. One of skill in the art is aware of methods for determining the thickness of a coating, for example as calculated from scanning electron microscope (SEM) images. Surface profilometer can also be used for the measurement of the coating thickness.

The $CeO_x$ coating preferably has a thickness of about 10 nm to about 1 μm and is transparent for visible light. The term "transparent" as used herein means that the $CeO_x$ coating is capable of transmitting visible light without appreciable scattering or absorption. More specifically, the total transmittance is preferably at least 60%, more preferably more than 80% and especially preferably at least about 90% at about 550 nm and further preferred in the visible region at a thickness of the $CeO_x$ coating of about 10 nm to about 1 μm. The transmittance and transmission, respectively, can be determined by conventional methods known to the skilled person, in particular in accordance with ASTM D 1003 by conventional spectrophotometer or hazemeter. The internal transmittance, i.e. considering possible absorption, is in particular above 76%, preferably above 85%, further preferred above 90% at about 550 nm and further preferred in the visible region at the thickness of the $CeO_x$ coating of about 10 nm to about 1 μm and more preferred of about 10 nm to about 100 nm. The total transmittance is more preferred at least about 92% at about 550 nm. An UV-VIS spectrometer is used for determining the transmittance.

The term "visible region" refers to the portion of the electromagnetic spectrum that is visible to the human eye, namely electromagnetic radiation having wavelengths from about 380 nm to 800 nm, in particular from about 400 nm to 700 nm.

The $CeO_x$ coating preferably has a good thermal stability preferably up to temperatures of about 900° C. in air, i.e. the coating properties can be sustained after thermal annealing up to temperatures of about 900° C. In particular, after the heat treatment at a temperature from 500° C. to 900° C. in air, coating properties such as hydrophobicity, wear resistance and hardness of the $CeO_x$ coating remain nearly unchanged. The corresponding measurements are carried out at room temperature. Teflon, the well-known hydrophobic material, will degrade or discompose at a temperature higher than 300° C. In the present invention, the obtained $CeO_x$ coating is thermally stable in terms of structure and coating properties.

The wear volume of the $CeO_x$ coating is preferably three orders of magnitude lower than that of Teflon after wear test. Wear tests can be carried out using a ball-on-disk tribometer with a WC-6Co counterpart, under dry sliding conditions.

The $CeO_x$ coating is further characterized by an advantageous adhesion/bonding strength of said coating to the substrate. No delamination of the $CeO_x$ coating can be observed along the scratch track. The adhesion of the $CeO_x$ coating, evaluated by the Daimler-Benz Rockwell-C test, preferably reaches strength quality HF1 (the highest quality). In the Rockwell-C indentation, a diamond cone indenter with an applied load of 150 kg is used. Once the load is removed, the indent is examined using an optical microscope and the coating adhesion is classified as HF1 to HF6, according to the amount of cracking or coating delamination around the indent. Only indents that are classified as HF1 and HF2 are regarded as having adequate adhesion.

The present invention refers in another aspect to a method for reducing the adhesion of a material to a surface of a substrate, i.e. for reducing the sticking behavior of the surface of the substrate. Said method comprises depositing a $CeO_x$ coating on the surface by means of a reactive magnetron sputtering from a pure cerium target. The surface preferably contains and more preferably is formed by a metal or a metal alloy or both of them. The reduction in adhesion means that less material such as tissue material adheres to or sticks on the surface of the substrate with the coating compared to the uncoated surface. More preferably, the weight of the material adhering to or sticking on the surface of the substrate is reduced by at least about 20%, more preferred by at least about 50%, and in particular by at least about 80%.

In a most preferred embodiment of the method, the material is tissue material which includes cells, cellular components and compounds from cells or fluids from an organism, in particular from a human which might be coagulated or charred. Preferably, the substrate is a medical instrument such as for electrosurgical operation which is preferably formed by steel or which has a surface of steel. In electrosurgical operation, electrode steel blades are used to cut and coagulate the tissue of a patient. Normally, the blades are conducted to radio frequency electrosurgical energy from a generator to the patient, and these blades are subjected to high temperatures during use. This high temperature causes proteins, carbohydrates and lipids in the patient to coagulate in the tissue as well as adhere to the working tip, leading to a drop of cutting efficiency and a higher power is needed. The hydrophobic $CeO_x$ coating can act as a non-sticking layer to reduce the adhesion of tissue materials sticking on the blade surface. In addition, the coating has a high thermal stability. The non-sticking property can be maintained at elevated temperatures.

The present invention in another aspect relates to a method for reducing water condensation and improving the heat transfer performance of a heat exchanger surface of a substrate comprising depositing a $CeO_x$ coating on the surface by means of a reactive magnetron sputtering from a pure cerium target. "Heat exchanger surface" means a surface used for heat exchange, i.e. heat transfer like a surface containing or being formed by a metal or a metal alloy or both of them. The substrate may be a part of an electric appliance.

Condensation is observed commonly in electric appliances and routinely used in industry as an effective method of heat transfer, e.g. refrigerator, air-conditioning. Water condensation on condenser metal surfaces results in the formation of a film of condensate that spreads over the condenser surface. This condensation imposes a thermal resistance across the surface, which limits the heat transfer performance. The $CeO_x$ coating can be applied to induce hydrophobicity to reduce the condensation, and improve the heat transfer performance. Due to high hardness and strong adhesion, it is expected that the coating can endure over extended periods of time. "Reducing water condensation" in particular means that the amount of condensed water on the surface with the $CeO_x$ coating is reduced by at least about 50 wt. % and in particular by more than about 80 wt. % compared to the uncoated surface during the operation of the heat exchanger surface.

The present invention further refers to a method for reducing corrosion of a surface of a substrate comprising depositing a $CeO_x$ coating on the substrate by means of a reactive magnetron sputtering from a pure cerium target. Reducing corrosion preferably includes increasing hardness, wear resistance and endurance of the surface and wherein the surface contains a metal or a metal alloy or both of them, and, thus, increasing the life-time of the material. The surface is in particular exposed to high stress pressure, heat, and abrasion environments. The substrate can for example have a surface containing a precious metal, copper or copper alloy. The term "corrosion" as used herein in particular refers to any degradation, rusting, weakening, deterioration, and the like of the surface. The term "reducing corrosion" as used herein refers to any improvement in minimizing, reducing, eliminating, or preventing corrosion, in particular it means preventing corrosion. Reducing corrosion can, for example, mean that the coated surface is not subjected to visible corrosion under normal use conditions and life-time of the substrate.

Hydrophobic and transparent coatings can further be applied to touch screen panels, self-cleaning glasses, solar energy panels, satellite dishes, textiles and nonstick cookware, etc.

The hydrophobic coatings can prevent the formation of a boundary layer with the water conduit and eliminate the boiling of nucleation site, allowing for much higher heat transfer efficiency. The coating is in particular water resistant and can resist the growth of microorganisms on them. The $CeO_x$ coating is further characterized by superior antifouling properties. Thus it can be applied as protective coating on marine vessels, submarines and oil rigs which are constantly exposed to harsh saline environment and also get covered by algae and other marine organisms. When applied as coatings on building material such as marbles and sandstone it can act as protection from environmental pollution and acid rain. It has self-cleaning, anti-fingerprint and anti-sticking behavior. Therefore, the $CeO_x$ coating is considered as an excellent substitute for the conventional low-surface-energy coatings, polymer-based coatings (i.e., Teflon) or artificial rough surfaces.

EXAMPLES

Example 1A

Deposition of a $CeO_x$ Coating on a Substrate with a Method of the Present Invention The $CeO_x$ coating was deposited in an unbalanced magnetron sputtering system by sputtering a cerium metallic target. Single crystalline silicon (100) wafers and glass were used as substrates. Before introducing into the deposition chamber, the substrates were ultrasonically cleaned to remove the grease and/or other dirtiness on the surface. The vacuum chamber was evacuated to a background pressure less than $4 \times 10^{-4}$ Pa. Prior to deposition, the substrates were sputter cleaned with Ar plasma for 20 min at a bias voltage of −450 V. Subsequently, $CeO_x$ coating was deposited onto the substrates with argon (Ar) and oxygen ($O_2$) flow rates of 20 and 15 sccm, respectively, corresponding to a working gas pressure of 0.33 Pa. During deposition, the bias voltage was reduced to −60 V. The coating thickness depended on the sputtering power as well as deposition time. The substrate was neither intentionally heated nor cooled during deposition.

Example 1B

Properties of the $CeO_x$ Coating Prepared in Example 1A

The as-deposited $CeO_x$ coatings were hydrophobic with a water contact angle around 110°.

The coating surface was very smooth with a root mean square (RMS) roughness of ~4.0 nm.

Both $Ce^{4+}$ and $Ce^{3+}$ existed on the coating surface, and the surface region was enriched in $Ce^{4+}$. The chemical bonding of cerium depended on the oxygen partial pressure during deposition.

The coating crystallized predominantly in cubic fluorite structure.

The hardness of the coating reached around 18 GPa.

The resultant $CeO_x$ coating exhibited excellent wear resistance with a wear volume two orders of magnitude lower than that of 316 stainless steel substrate and three orders of magnitude lower than that of Teflon.

LIST OF REFERENCE SIGNS

1 Substrate
1a Holder
2 Pure cerium target (cathode)
2a Magnet holding plate
2b Ring magnet
2c Central magnet
2d Magnetic field lines
3 Rotating shaft for the holder (rotation speed 0-20 rpm)
4 Inlet for $Ar/O_2$ mixed gas
5 Outlet to vacuum pump
6 Shields
7 Vacuum chamber (connected to ground)
8 Vacuum gauge
9 Pulsed power supply to drive the magnetron (frequency 100-350 kHz)
10 Bias power supply to the substrate holder (frequency can be adjusted, i.e., 250 kHz)

The invention claimed is:

1. A method for preparing a crystallized $CeO_x$ coating having a cubic fluorite structure and a thickness of about 10 nm to about 100 nm on a surface of a substrate in an unbalanced magnetron sputtering system comprising a step of depositing the crystallized $CeO_x$ coating essentially consisting of $Ce_2O_3$ and/or $CeO_2$ on the surface by means of a reactive magnetron sputtering from a cerium target having a purity of at least about 99.9%, wherein the reactive magnetron sputtering is carried out, in a closed magnetic field coupling arrangement, with a pulsed sputtering voltage applied to the cerium target of about −200 V to about −500 V pulsed in a frequency range of about 100 kHz to about 350 kHz, a pulsed substrate bias voltage of between about −60 V and −100 V, at a temperature between about 20° C. and about 30° C., and with a bias ion current density of between about 1 $mA/cm^2$ and about 5 $mA/cm^2$, wherein the reactive magnetron sputtering is carried out in a deposition chamber filled with a gas mixture of a working gas comprising argon for sputtering the cerium target and a reactive gas comprising oxygen arranged to react with atoms sputtered from the cerium target during the step of depositing of the crystallized $CeO_x$ coating on the substrate, and wherein the gas mixture includes an oxygen to argon flow ratio in a range of about 20% to about 100%.

2. The method of claim 1, wherein the pulsed substrate bias voltage applied to the substrate is pulsed at a frequency of about 250 kHz.

3. The method of claim 1 further comprising a step of cleaning the substrate comprising a step of plasma cleaning before the step of depositing in vacuum.

4. The $CeO_x$ coating of claim 1, wherein the coating is hydrophobic.

5. The $CeO_x$ coating of claim 4, wherein the contact angle for water is about 110°.

6. The $CeO_x$ coating of claim 1, wherein the coating has a hardness of about 18 GPa.

7. The $CeO_x$ coating of claim 1, wherein the coating is transparent for visible light.

8. The $CeO_x$ coating of claim 7, wherein the total transmittance is at least about 90% at 550 nm.

9. The $CeO_x$ coating of claim 1, wherein the coating has a thermal stability up to temperatures of about 900° C. in air.

10. A method for reducing the adhesion of a tissue material to a surface of a medical instrument in an unbalanced magnetron sputtering system comprising depositing a crystallized $CeO_x$ coating having a cubic fluorite structure and a thickness of about 10 nm to about 100 nm, said crystallized $CeO_x$ coating essentially consisting of $Ce_2O_3$ and/or $CeO_2$ on the surface by means of a reactive magnetron sputtering from a cerium target having a purity of at least about 99.9%, wherein the reactive magnetron sputtering is carried out, in a closed magnetic field coupling arrangement, with a pulsed sputtering voltage applied to the cerium target of about −200 V to about −500 V pulsed in a frequency range of about 100 kHz to about 350 kHz, a pulsed substrate bias voltage of between about −60 V and −100 V, at a temperature between about 20° C. and about 30° C., and with a bias ion current density of between about 1 mA/cm² and about 5 mA/cm², wherein the reactive magnetron sputtering is carried out in a deposition chamber filled with a gas mixture of a working gas comprising argon for sputtering the cerium target and a reactive gas comprising oxygen arranged to react with atoms sputtered from the cerium target during the depositing of the crystallized $CeO_x$ coating on the substrate, and wherein the gas mixture includes an oxygen to argon flow ratio in a range of about 20% to about 100%.

11. The method of claim 10, wherein the surface contains a metal or a metal alloy or both of them.

12. The method of claim 10, wherein the surface is of steel.

13. A method for reducing water condensation and improving heat transfer performance of a heat exchanger surface of a substrate in an unbalanced magnetron sputtering system comprising depositing a crystallized $CeO_x$ coating having a cubic fluorite structure and a thickness of about 10 nm to about 100 nm, said crystallized $CeO_x$ coating essentially consisting of $Ce_2O_3$ and/or $CeO_2$ on the heat exchanger surface by means of a reactive magnetron sputtering from a cerium target having a purity of at least about 99.9%, wherein the reactive magnetron sputtering is carried out, in a closed magnetic field coupling arrangement, with a pulsed sputtering voltage applied to the cerium target of about −200 V to about −500 V pulsed in a frequency range of about 100 kHz to about 350 kHz, a pulsed substrate bias voltage of between about −60 V and −100 V, at a temperature between about 20° C. and about 30° C., and with a bias ion current density of between about 1 mA/cm² and about 5 mA/cm², wherein the reactive magnetron sputtering is carried out in a deposition chamber filled with a gas mixture of a working gas comprising argon for sputtering the cerium target and a reactive gas comprising oxygen arranged to react with atoms sputtered from the cerium target during the deposition of the crystallized $CeO_x$ coating on the substrate, and wherein the gas mixture includes an oxygen to argon flow ratio in a range of about 20% to about 100%.

14. A method for reducing corrosion of a surface of a substrate in an unbalanced magnetron sputtering system comprising depositing a crystallized $CeO_x$ coating having a cubic fluorite structure and a thickness of about 10 nm to about 100 nm, said crystallized $CeO_x$ coating essentially consisting of $Ce_2O_3$ and/or $CeO_2$ on the surface by means of a reactive magnetron sputtering from a cerium target having a purity of at least about 99.9%, wherein the reactive magnetron sputtering is carried out, in a closed magnetic field coupling arrangement, with a pulsed sputtering voltage applied to the cerium target of about −200 V to about −500 V pulsed in a frequency range of about 100 kHz to about 350 kHz, a pulsed substrate bias voltage of between about −60 V and −100 V, at a temperature between about 20° C. and about 30° C., and with a bias ion current density of between about 1 mA/cm² and about 5 mA/cm², wherein the reactive magnetron sputtering is carried out in a deposition chamber filled with a gas mixture of a working gas comprising argon for sputtering the cerium target and a reactive gas comprising oxygen arranged to react with atoms sputtered from the cerium target during the depositing of the crystallized $CeO_x$ coating on the substrate, and wherein the gas mixture includes an oxygen to argon flow ratio in a range of about 20% to about 100%.

15. The method of claim 14, wherein reducing corrosion includes increasing hardness, wear resistance, and endurance of the surface.

16. The method of claim 1, wherein the substrate comprises metal, metal alloy, silicon, or glass.

17. The method of claim 1, wherein the crystallized $CeO_x$ coating essentially consisting of $Ce_2O_3$ and/or $CeO_2$ is deposited with a deposition rate of up to 30 nm/min.

18. The method of claim 3, wherein the step of plasma cleaning is carried out at a bias voltage from about −300 V to about −600 V for at least 20 minutes.

* * * * *